(12) United States Patent
Luc

(10) Patent No.: US 11,575,056 B1
(45) Date of Patent: Feb. 7, 2023

(54) REPAIRING A SOLAR CELL BONDED ON A FLEXIBLE CIRCUIT

(71) Applicant: The Boeing Company, Chicago, IL (US)

(72) Inventor: Phil Luc, Los Angeles, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 17/337,890

(22) Filed: Jun. 3, 2021

Related U.S. Application Data

(60) Provisional application No. 63/052,278, filed on Jul. 15, 2020.

(51) Int. Cl.
| | | |
|---|---|---|
| *H01L 31/043* | (2014.01) | |
| *H01L 31/18* | (2006.01) | |
| *H01L 31/05* | (2014.01) | |

(52) U.S. Cl.
CPC ........ *H01L 31/043* (2014.12); *H01L 31/0504* (2013.01); *H01L 31/186* (2013.01)

(58) Field of Classification Search
CPC ... H01L 31/043; H01L 31/05; H01L 31/0504; H01L 31/186
See application file for complete search history.

(56) References Cited

U.S. PATENT DOCUMENTS

| | | | | |
|---|---|---|---|---|
| 5,118,361 A | * | 6/1992 | Fraas | .................. H01L 31/0543 438/65 |
| 6,809,250 B2 | | 10/2004 | Gerson | |
| 7,998,760 B2 | * | 8/2011 | Tabe | ...................... H01L 31/188 438/66 |
| 2010/0084003 A1 | | 4/2010 | Chen | |
| 2010/0240153 A1 | * | 9/2010 | Tabe | ...................... H01L 31/188 438/4 |

FOREIGN PATENT DOCUMENTS

DE   20217067   1/2003

OTHER PUBLICATIONS

Extended European Search Report dated Nov. 18, 2021 for European Patent Application No. 21181959.4.

* cited by examiner

*Primary Examiner* — Golam Mowla
(74) *Attorney, Agent, or Firm* — Gates & Cooper LLP

(57) ABSTRACT

A method of repairing a solar cell bonded on a substrate, by bonding a replacement solar cell on top of an existing solar cell, without removing the existing solar cell. The substrate may comprise a flexible circuit, printed circuit board, flex blanket, or solar cell panel. The bonding of the replacement solar cell on top of the existing solar cell uses a controlled adhesive pattern. Electrical connections for the existing solar cell and the replacement solar cell are made using electrical conductors on, above or embedded within the substrate. The electrical connections may extend underneath the replacement solar cell. The method further comprises removing interconnects for the electrical connections for the existing solar cell, and then welding or soldering interconnects for the electrical connections for the replacement solar cell.

20 Claims, 14 Drawing Sheets

REPAIRING A SOLAR CELL BONDED ON A FLEXIBLE CIRCUIT

CROSS REFERENCE TO RELATED APPLICATIONS

This application claims the benefit under 35 U.S.C. Section 119(e) of the following commonly-assigned application:

U.S. Provisional Application Ser. No. 63/052,278, filed on Jul. 15, 2020, by Phil Luc, entitled "REPAIRING A SOLAR CELL BONDED ON A FLEXIBLE CIRCUIT,";

which application is incorporated by reference herein.

BACKGROUND

1. Field

The disclosure is related generally to repairing a solar cell bonded on a flexible circuit.

2. Background

Currently, when an existing solar cell is damaged or defective, the entire cell is typically removed from a substrate or housing upon which the existing solar cell is situated. A replacement solar cell is then situated on the substrate or housing in place of the existing solar cell and electrically interconnected to other solar cells in an array.

However, extracting and removing the existing solar cell relies on the skill of an operator in removing the existing solar cell that is damaged or defective, since connection tabs and contact pads need to be preserved, and also to minimize collateral damage. Moreover, extracting and removing the existing solar cell takes more time than is desired.

Thus, there is a need for improved methods for repairing a solar cell bonded on a flexible circuit.

SUMMARY

To overcome the limitations described above, and to overcome other limitations that will become apparent upon reading and understanding the present specification, the present disclosure describes a method of repairing an existing solar cell bonded on a substrate, by bonding a replacement solar cell on top of the existing solar cell, without removing the entire existing solar cell. The substrate may comprise a flexible circuit, printed circuit board, flex blanket, or panel. The bonding of the replacement solar cell on top of the existing solar cell uses a controlled adhesive pattern.

Electrical connections for the existing and replacement solar cells are made using electrical conductors on, above or embedded within the substrate. The electrical connections may extend underneath the replacement solar cell.

The method further comprises removing interconnects for the electrical connections for the existing solar cell, welding or soldering interconnects for the electrical connections for the replacement solar cell to the substrate, welding or soldering interconnects for the electrical connections for the replacement solar cell above the substrate, and/or welding or soldering interconnects for the electrical connections for the replacement solar cell outside a stack comprised of the replacement solar cell bonded to the existing solar cell.

DRAWINGS

Referring now to the drawings in which like reference numbers represent corresponding parts throughout:

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

Overview

Figure 1:
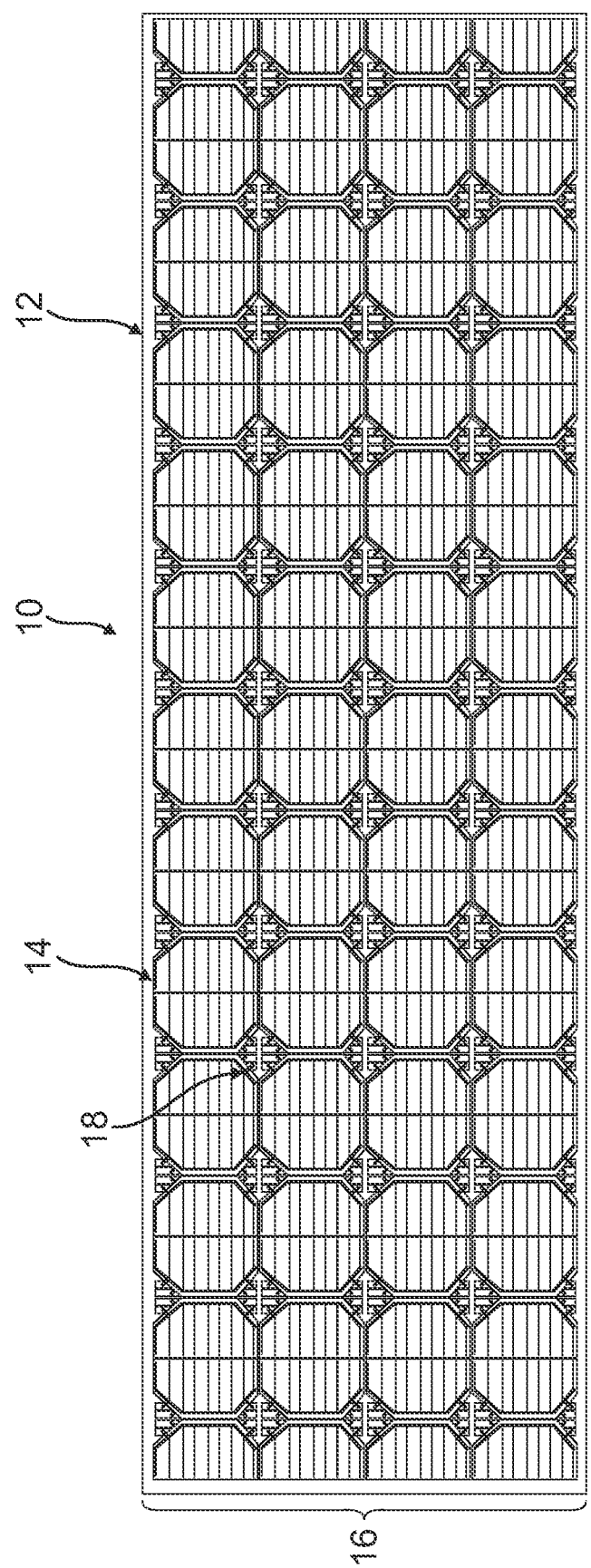
FIG. 1 illustrates one possible structure for a solar cell panel.

FIG. 1 illustrates one possible structure for a solar cell panel 10, which includes a substrate 12, a plurality of solar cells 14 arranged in an array 16 and bonded to the substrate 12, and electrical connections 18 between the solar cells 14. The substrate 12 may be a flexible circuit, also known as a flex sheet assembly. The electrical connections 18 between solar cells 14 may be made using electrical conductors on, above, or embedded within the substrate 12. The electrical connections 18 may comprise series connections between the solar cells 14, or may terminate a resulting circuit so that current may be brought off of the panel 10.

If at least one of the solar cells 14 is a defective solar cell 14, or if there is a problem with its electrical connections 18, after the defective solar cell 14 has been bonded on the substrate 12 and mounted on the solar cell panel 10, the defective solar cell 14 may need to be replaced. Solar cell 14 replacement on a solar cell panel 10 currently requires mechanical removal of an existing defective solar cell 14 and bonding of a replacement solar cell 14 in its place.

This disclosure describes a method of repairing the existing defective solar cell 14 by bonding the replacement solar cell 14 on top of the existing defective solar cell 14 with minimal removal effort of the existing defective solar cell 14. For example, surface preparation may be performed, e.g., using a diamond coated tip scriber to scribe the coverglass, as well as cleaning and priming the two mating surfaces. Moreover, the method applies to solar cells 14 bonded to substrates 12 comprising flexible circuits, printed circuit boards or flex blankets, as well as solar cell panels 10.

This disclosure reduces the amount of time necessary to repair an existing defective solar cell 14. Moreover, prior methods of repairing solar cells 14 may damage the substrate 12 and/or solar cell panel 10, for example, disturbing or compromising insulation underneath the existing defective solar cell 14 can result in the shorting of the solar cell 14 string to the substrate 12 with a resulting power loss, while this disclosure leaves the substrate 12 and/or solar cell panel 10, and their components almost undisturbed. Consequently, this disclosure results in both cost savings and as well as increased product reliability.

Thus, a key feature of this disclosure includes a method of bonding the replacement solar cell 14 on top of the existing defective solar cell 14. Another feature is the bonding of the replacement solar cell 14 on top of the existing defective solar cell 14 using a controlled adhesive pattern. Yet another feature is that several different versions of electrical connections 18 are provided: (1) a first version is to weld and/or solder the electrical connections 18 for the replacement solar cell 14 to the substrate 12; (2) a second version is to weld and/or solder the electrical connections 18 outside a stack comprised of the replacement solar cell 14 bonded to the existing defective solar cell 14; and (3) a third version is to place the electrical connections 18 underneath the replacement solar cell 14, so that the electrical connections 18 are essentially hidden. All of these combinations are different from the general bonding of a solar cell 14 on top of another solar cell 14.

First Example

Figure 2:
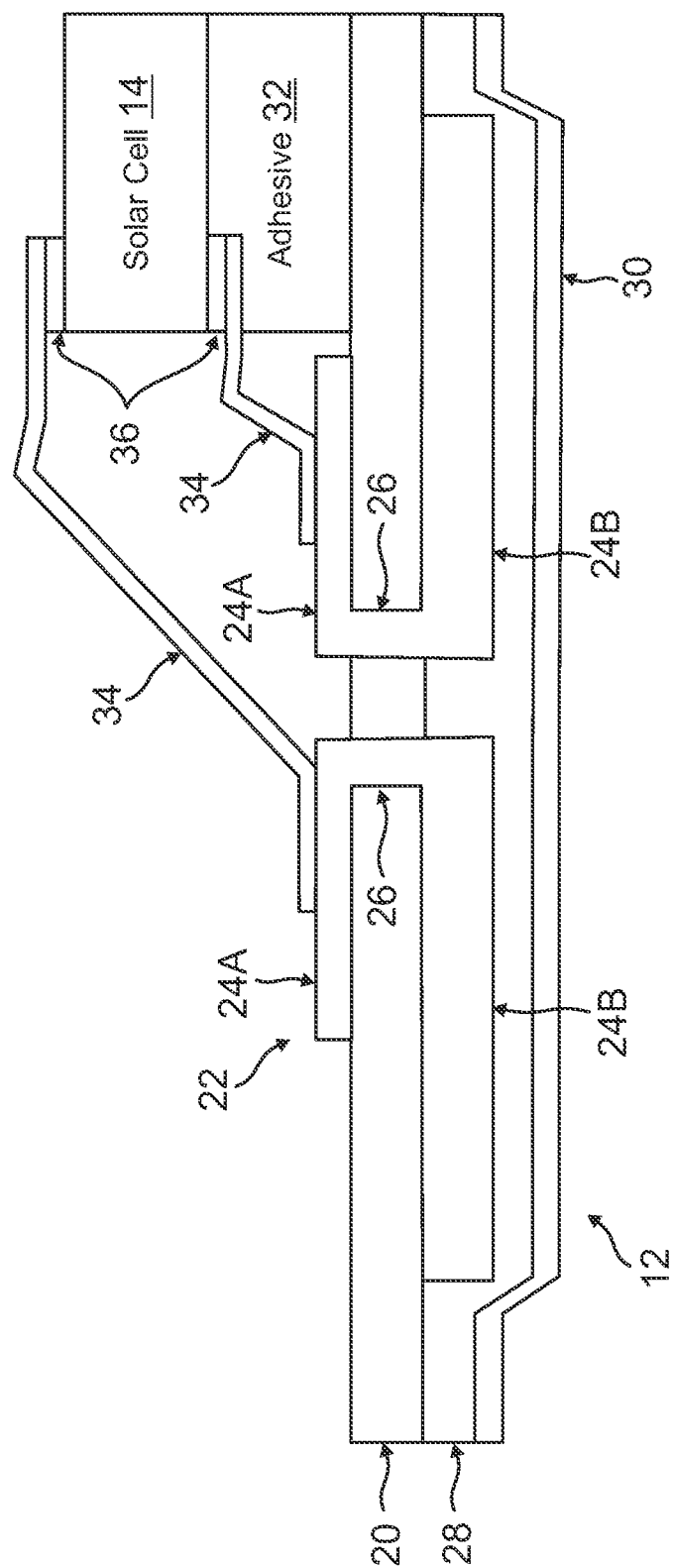
FIGS. 2, 3 and 4 are cross-sectional side views of a first example where electrical connections for the solar cells are made onto a substrate.

FIG. 2 shows a cross-sectional side view of a first example, wherein the substrate 12 may include, inter alia, a Kapton™ or polyimide base layer 20 with multilayer electrical conductors 22 comprising one or more Copper (Cu) layers 24A deposited on a top surface of the polyimide base layer 20 and one or more Cu layers 24B deposited on a bottom surface of the polyimide base layer 20, wherein a via 26 electrically connects Cu layer 24A with Cu layer 24B.

The Cu layer 24A, which may be with plated with Silver (Ag) or Gold (Au) (not shown), may be patterned to form electrical conductors 22 on the surface of the substrate 12, while the Cu layer 24B may be patterned to form electrical conductors 22 embedded within the substrate 12. The structure of the substrate 12 enables the electrical conductors 22 of the Cu layer 24B, and thus the electrical connections 18, to extend underneath the solar cell 14.

Another polyimide layer 28 may sandwich the Cu layer 24B with the polyimide base layer 20, resulting in a laminate structure. A conducting back sheet of polyimide 30 can be applied to the substrate 12 as well, which is useful in a space environment in that it will reduce the accumulation of charge.

Shown on the right side is the solar cell 14 that is attached to the substrate 12 with an adhesive 32. Also visible are the metal foil interconnects 34 that electrically connect to contacts 36, such as contact pads or connection tabs, on the solar cell 14 and the Cu layer 24A.

Figure 3:
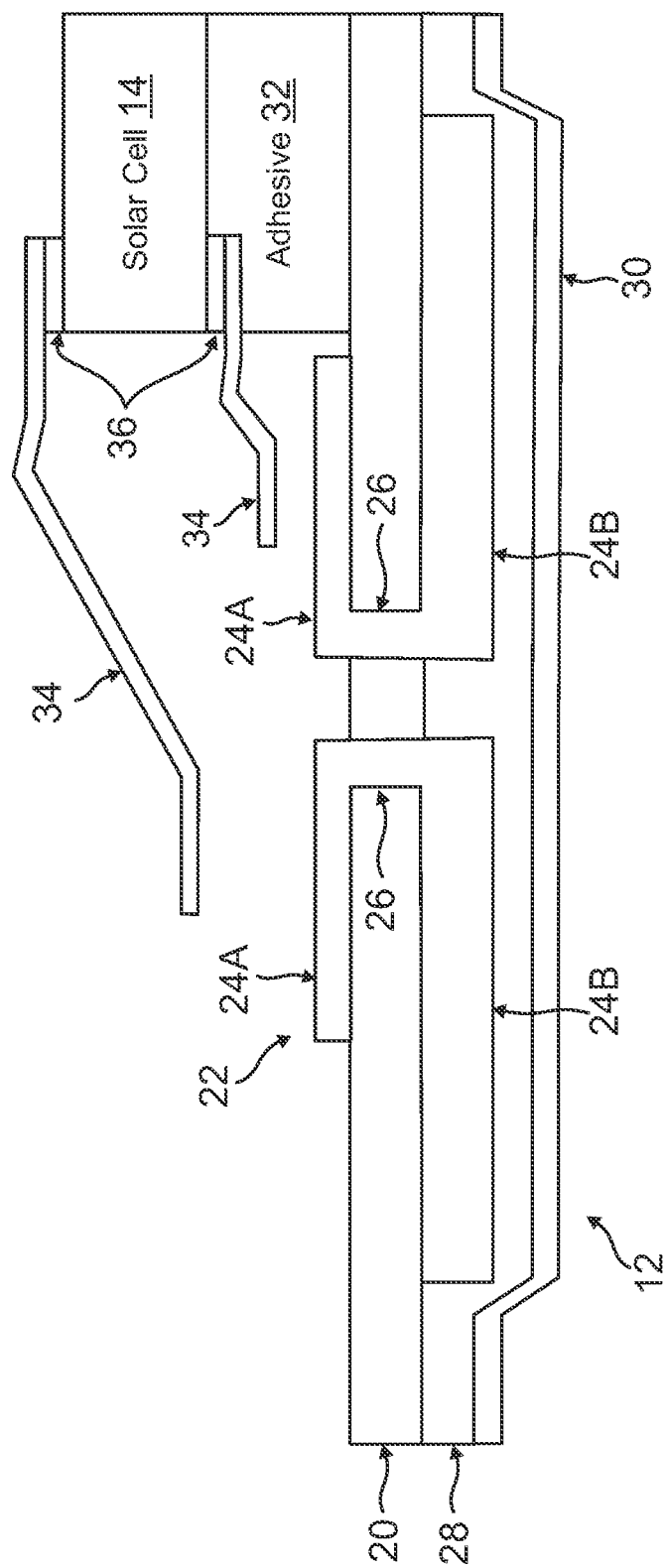

FIG. 3 illustrates the example of FIG. 2 where the solar cell 14 is defective and the metal foil interconnects 34 are removed from the substrate 12. Alternatively, or at the same time, the metal foil interconnects 34 may be removed from the solar cell 14. This step may result in the removal of a portion of the Cu layer 24A, and possibly other portions of the substrate 12. Alternatively, or at the same time, this step may also result in the removal of a portion of the solar cell 14, such as contacts 36 on the solar cell 14 for the interconnects 34, and possibly other portions of the solar cell 14.

Figure 4:
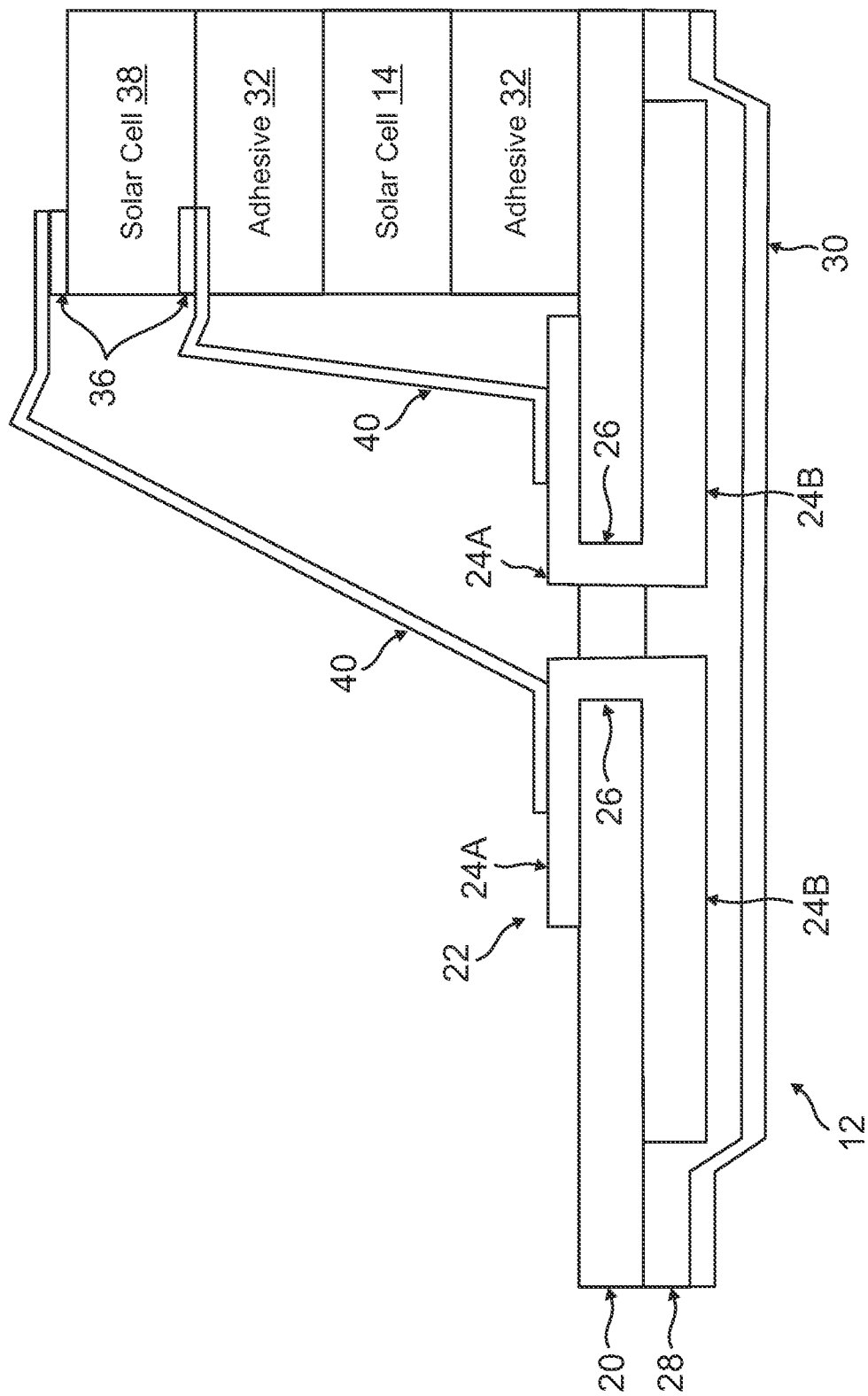

FIG. 4 shows a proposed method for repairing an existing solar cell 14, based on the example of FIGS. 2 and 3, wherein the existing solar cell 14 is defective, and a replacement solar cell 38 is bonded on top of the existing defective solar cell 14 using a controlled adhesive 32 pattern. Then, replacement interconnects 40 for the electrical connections 18 are welded or soldered to the contacts 36 of the replacement solar cell 38, as well as the Cu layer 24A, to electrically connect the replacement solar cell 38 to the Cu layer 24A on the substrate 12. Specifically, this involves welding or soldering interconnects 40 for the electrical connections 18 for the replacement solar cell 38 outside a stack comprised of the replacement solar cell 38 bonded to the existing solar cell 14.

Note that an area of the Cu layer 24A used for the electrical connection 18 may be large enough that one or more additional electrical connections 18 can be made in the area. For example, the replacement interconnects 40 extending from the replacement solar cell 38 may make contact with the Cu layer 24A in the same location as the interconnects 34 or an adjacent location that avoids the same location as the interconnects 34, wherein the adjacent location has enough of the electrical conductor 22 for electrical current to flow around any damaged portion of the Cu layer 24A.

Second Example

Figure 5:
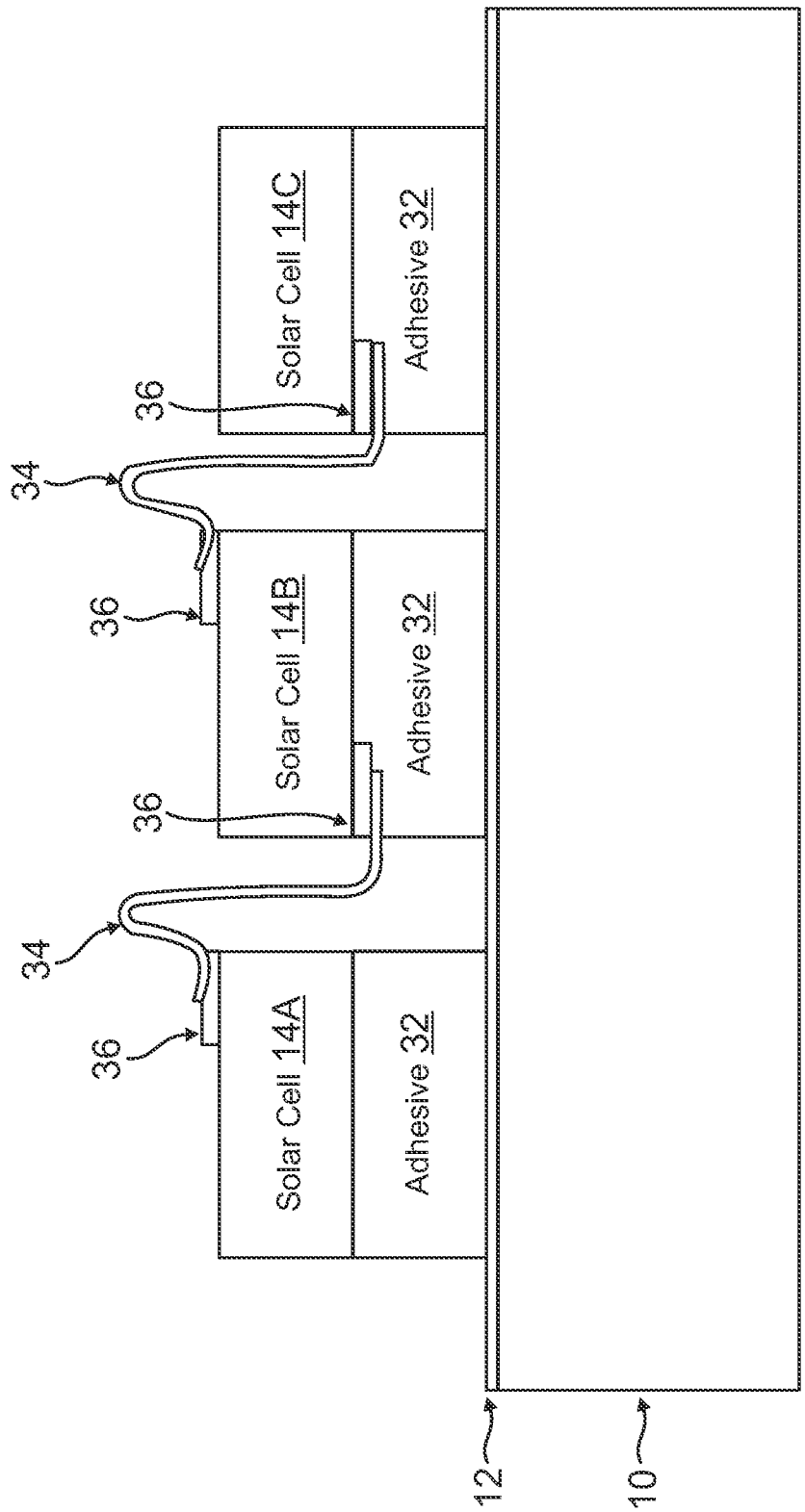
FIGS. 5, 6, 7 and 8 are cross-sectional side views of a second example where electrical connections for the solar cells are made above a substrate and panel.

FIG. 5 shows a cross-sectional side view of a second example, wherein the metal foil interconnects 34 electrically connect the solar cells 14A, 14B, 14C bonded to the substrate 12 and the panel 10, which is shown as a rigid composite/aluminum honeycomb panel 10.

Figure 6:
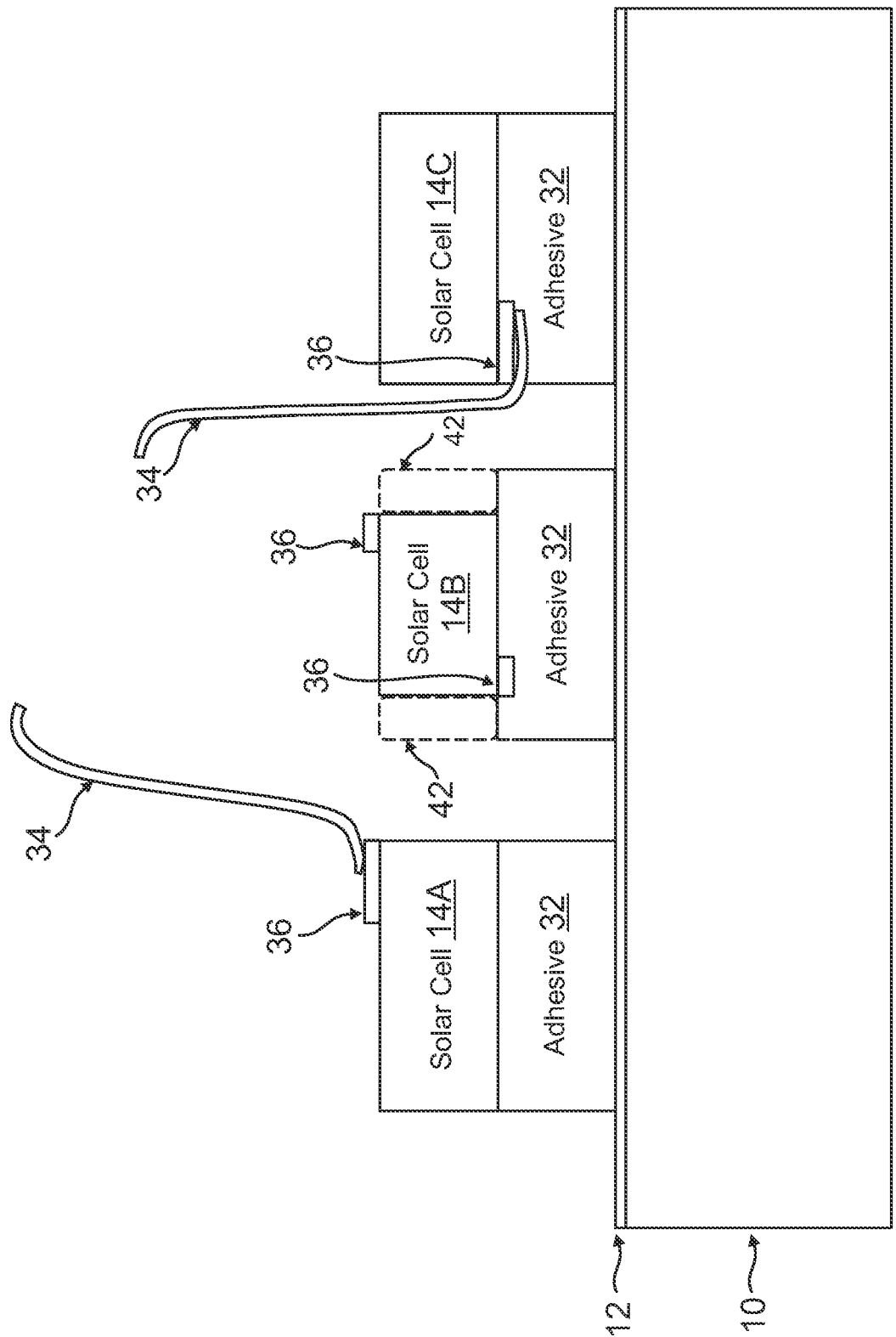

FIG. 6 illustrates the example of FIG. 5, where the existing solar cell 14B is defective and the metal foil interconnects 34 from the solar cell 14A are removed from the existing defective solar cell 14B, and the metal foil interconnects 34 to the solar cell 14C are removed from the existing defective solar cell 14B. This step may also result in the removal of portions of the existing defective solar cell 14B indicated by dashed lines 42, such as contacts 36 for the interconnects 34, and possibly other portions of the existing defective solar cell 14B.

Figure 7:
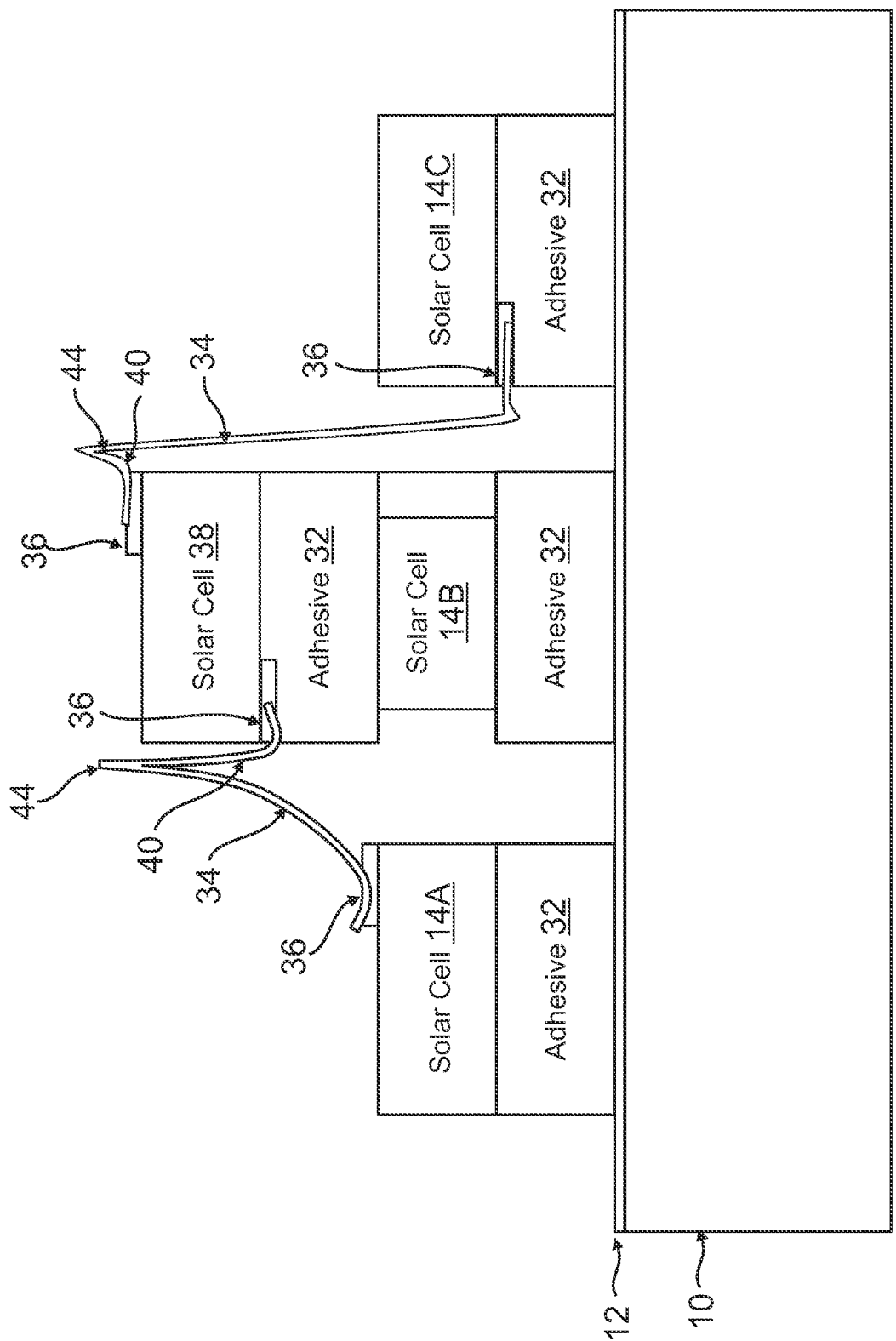

FIG. 7 shows a proposed method for repairing the existing defective solar cell 14B, based on the example of FIGS. 5 and 6, wherein a replacement solar cell 38 is bonded on top of the existing defective solar cell 14B using a controlled adhesive 32 pattern or another material. Then, replacement interconnects 40 for the electrical connections 18 between the top contacts 36 of the solar cell 14A and the bottom contacts 36 of the replacement solar cell 38, and replacement interconnects 40 for the electrical connections 18 between the bottom contacts 36 of the solar cell 14C and the top contacts 36 of the replacement solar cell 38, are welded or soldered at connection points 44 outside and/or above the replacement cell 38, and above the substrate 12 and panel 10. Alternatively, the replacement interconnects 40 for the electrical connections 18 may be welded or soldered directly to the top and bottom contacts 36 of the solar cells 14A, 14C and 38.

Figure 8:
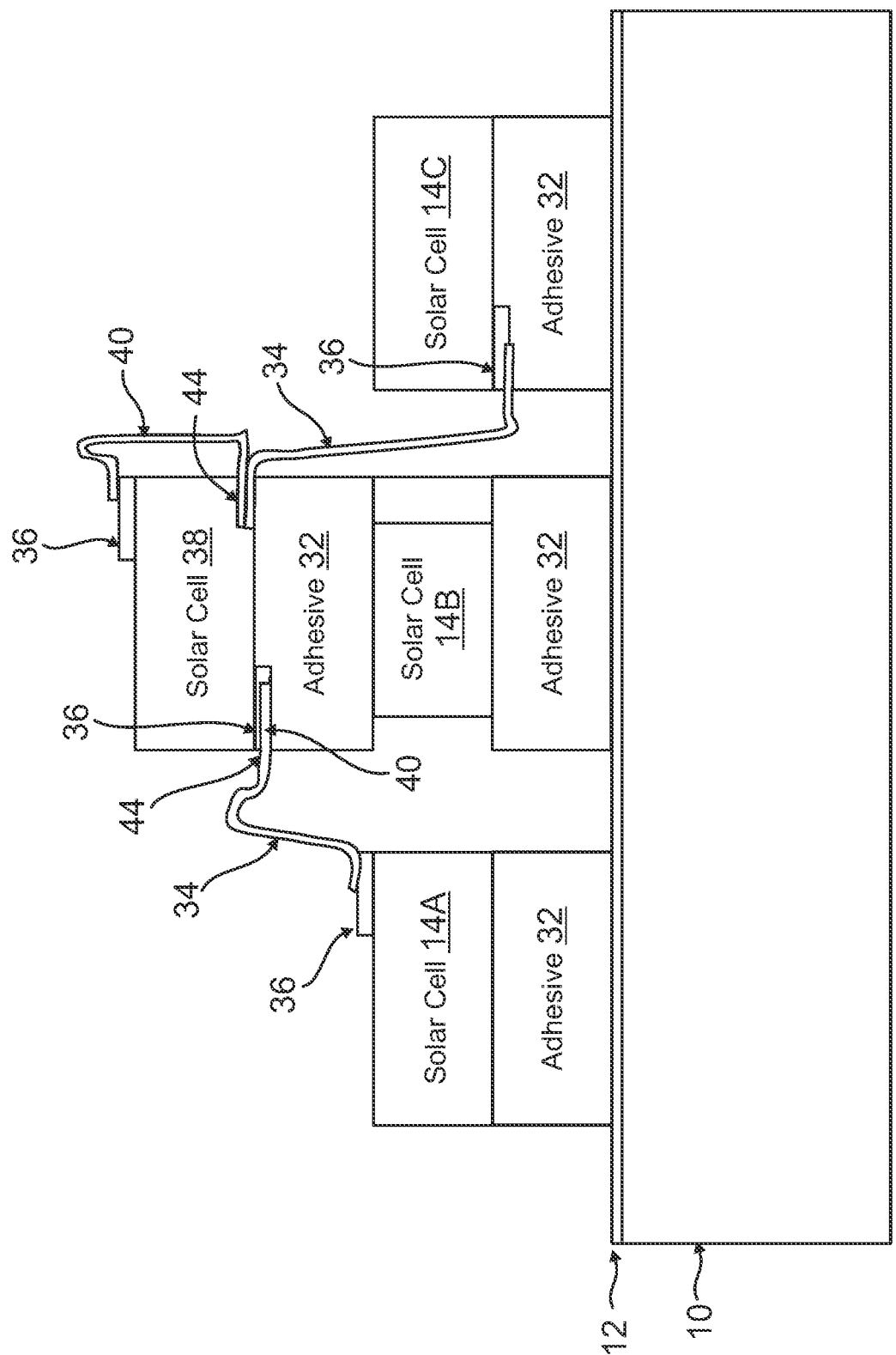

FIG. 8 shows a proposed method for repairing the existing defective solar cell 14B, based on the example of FIGS. 5, 6 and 7, wherein a replacement solar cell 38 is bonded on top of the existing defective solar cell 14B using a controlled adhesive 32 pattern or another material. Then, replacement interconnects 40 for the electrical connections 18 between the top contacts 36 of the solar cell 14A and the bottom contacts 36 of the replacement solar cell 38, and replacement interconnects 40 for the electrical connections 18 between the bottom contacts 36 of the solar cell 14C and the top contacts 36 of the replacement solar cell 38, are welded or soldered at connection points 44 under the replacement solar cell 38, and above the substrate 12 and panel 10. Making the connection points 44 above the replacement cell 38, as shown in FIG. 7, is easier to access, but sometimes there is a height requirement that requires the connection points 44 be made underneath the replacement cell 38 because the connection points 44 made above the replacement cell 38 are taller than the stack. Alternatively, the replacement interconnects 40 for the electrical connections 18 may be welded or soldered directly to the contacts 36 of solar cells 14A, 14C and 38.

Third Example

Figure 9:
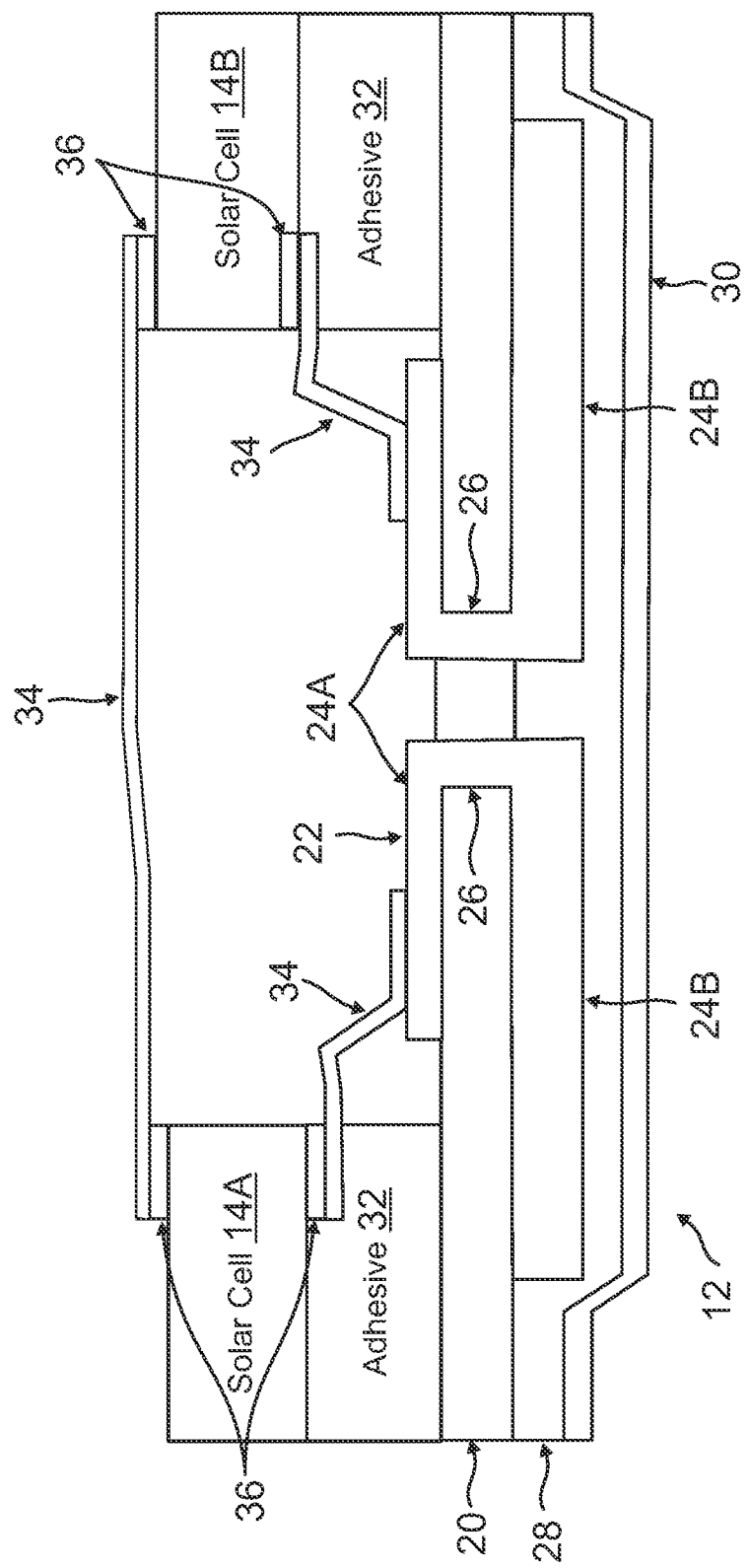
FIGS. 9, 10 and 11 are cross-sectional side views of a third example where electrical connections for the solar cells are made above a substrate.

FIG. 9 shows a cross-sectional side view of a third example, similar to the first and second examples, except that one of the metal foil interconnects 34 electrically connects two solar cells 14A, 14B above the substrate 12 without contacting the Cu layer 24A, while others of the metal foil interconnects electrically connect the two solar cells 14A, 14B on the substrate 12 by contacting the Cu layers 24A.

Figure 10:
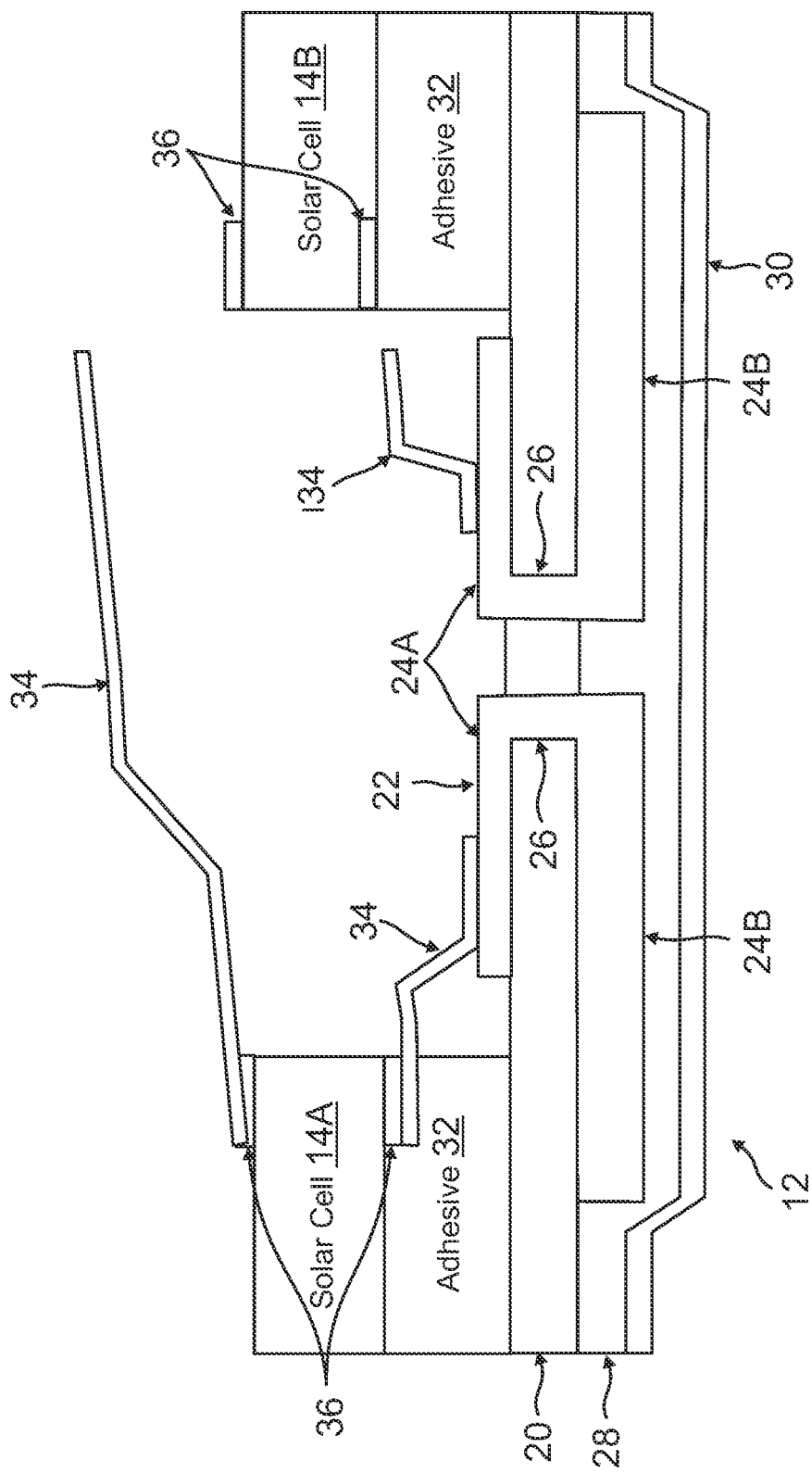

FIG. 10 illustrates the example of FIG. 9, where the existing solar cell 14B is defective and the metal foil interconnects 34 are removed from the existing defective solar cell 14B. This step may also result in the removal of a portion of the existing defective solar cell 14B, such as contacts 36 for the interconnects 34 and possibly other portions of the existing defective solar cell 14B. Alternatively, the metal foil interconnects 34 could be removed from the solar cell 14A, which may also result in the removal of a portion of the solar cell 14A, such as contacts 36 for the interconnects 34 and possibly other portions of the solar cell 14A.

Figure 11:
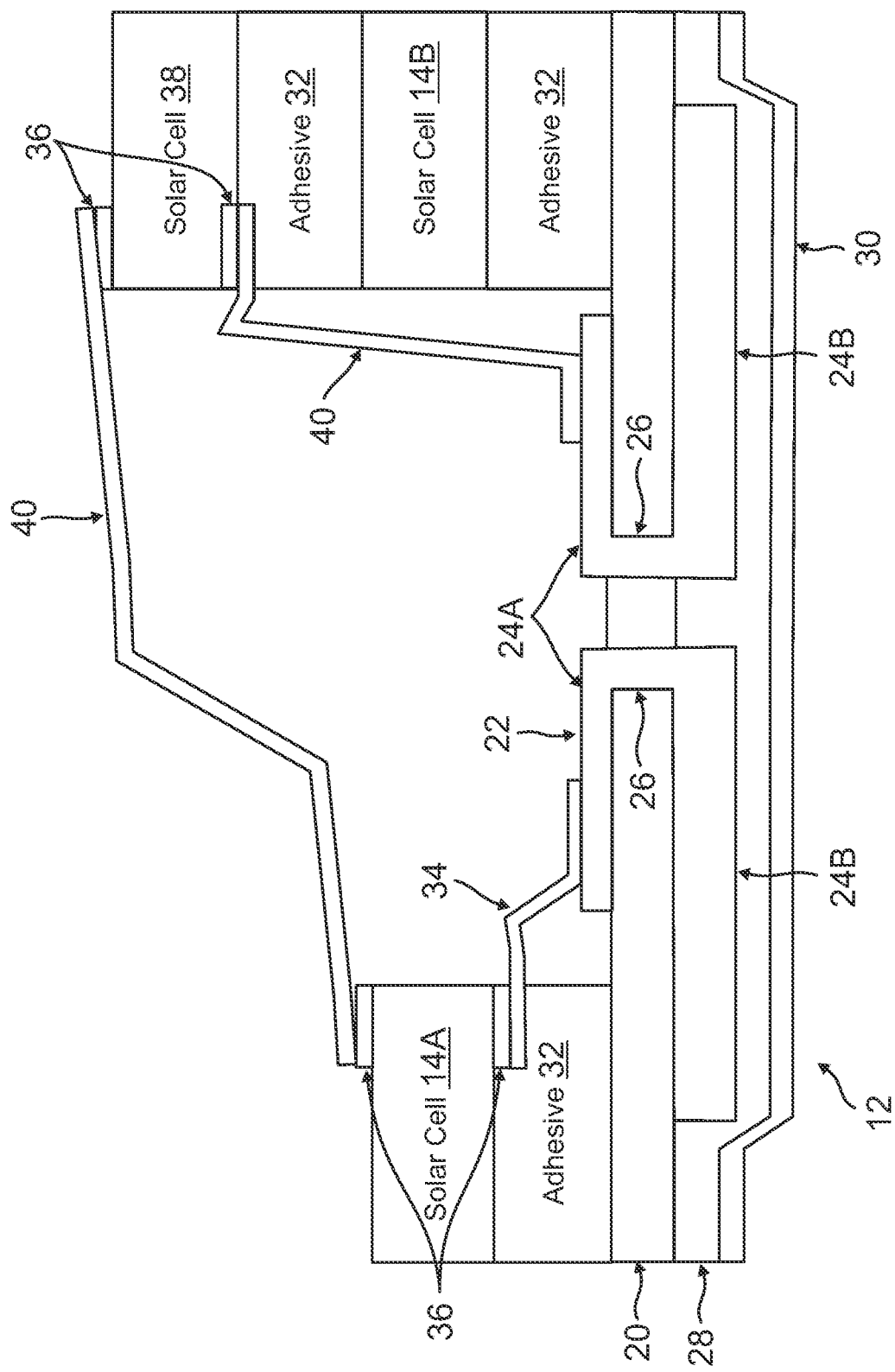

FIG. 11 shows a proposed method for repairing the existing defective solar cell 14B, based on the example of FIGS. 9 and 10, wherein a replacement solar cell 38 is bonded on top of the existing defective solar cell 14B using a controlled adhesive 32 pattern or another material. Then, replacement interconnects 40 for the electrical connections 18 are welded or soldered to the top contacts 36 of the replacement solar cell 38, as well as the top contacts 36 of the solar cell 14A, above the substrate 12. The replacement interconnects 40 for the electrical connections 18 are also welded or soldered to the bottom contacts 36 of the replacement solar cell 38 to electrically connect the replacement solar cell 38 to the Cu layer 24A. Alternatively, the replacement interconnects 40 may be welded or soldered to the metal foil interconnects 34 removed from the existing defective solar cell 14B, where the metal foil interconnect 34 is still attached to the solar cell 14A.

Aerospace Applications

Figure 12:
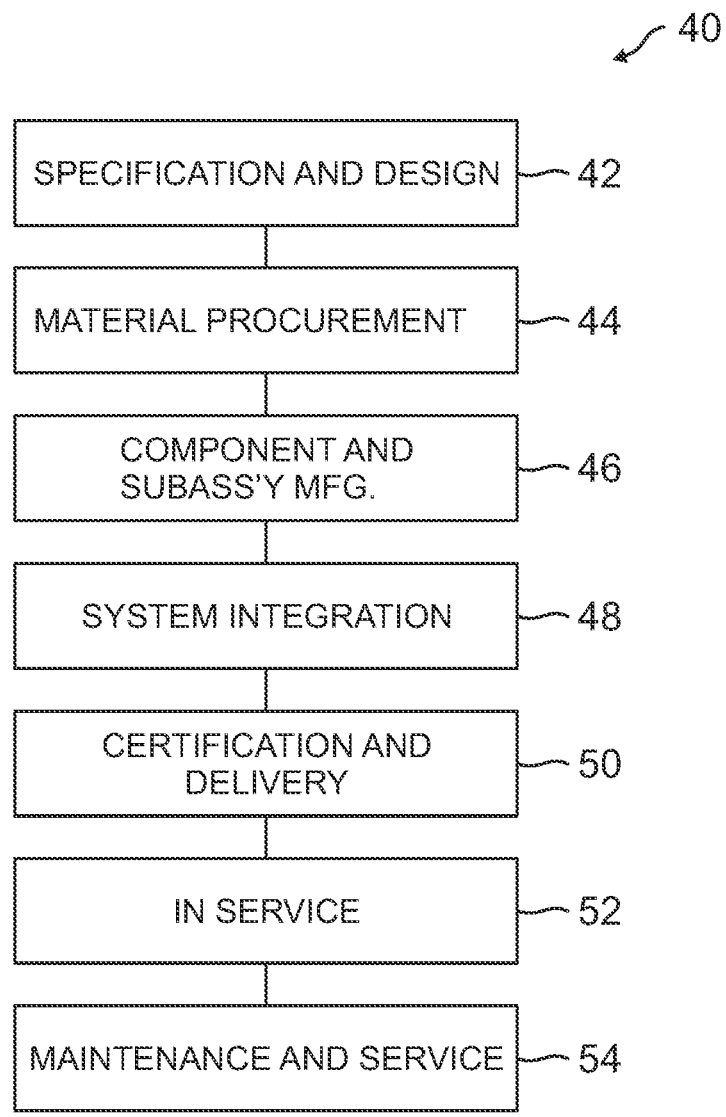
FIGS. 12, 13 and 14 illustrate examples of the disclosure made in the context of aerospace applications.
Figure 13:
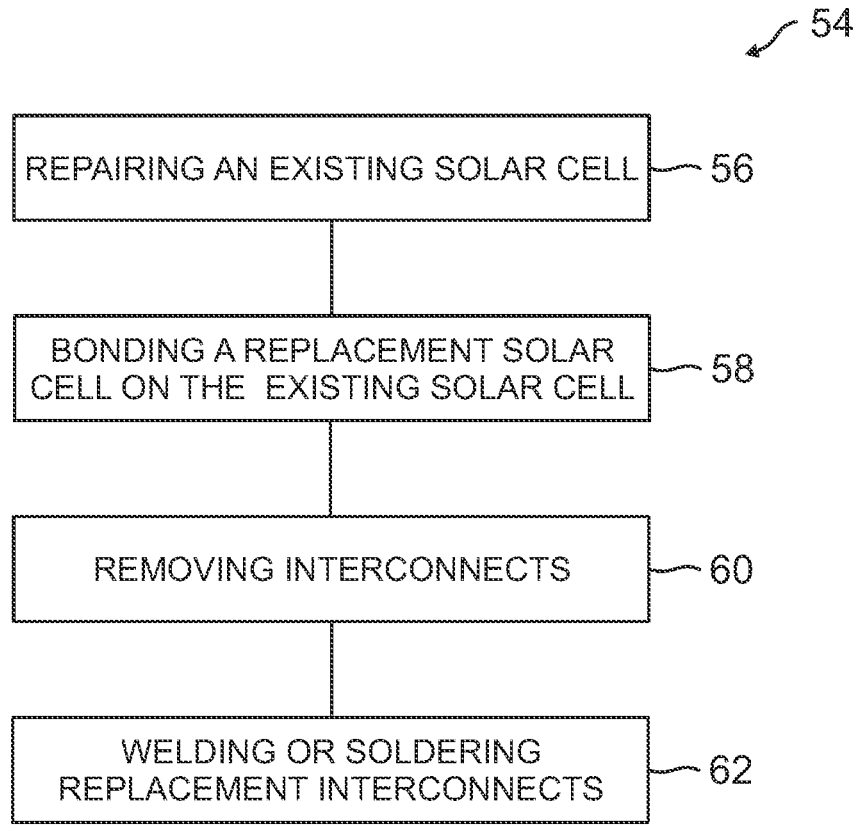
Figure 14:
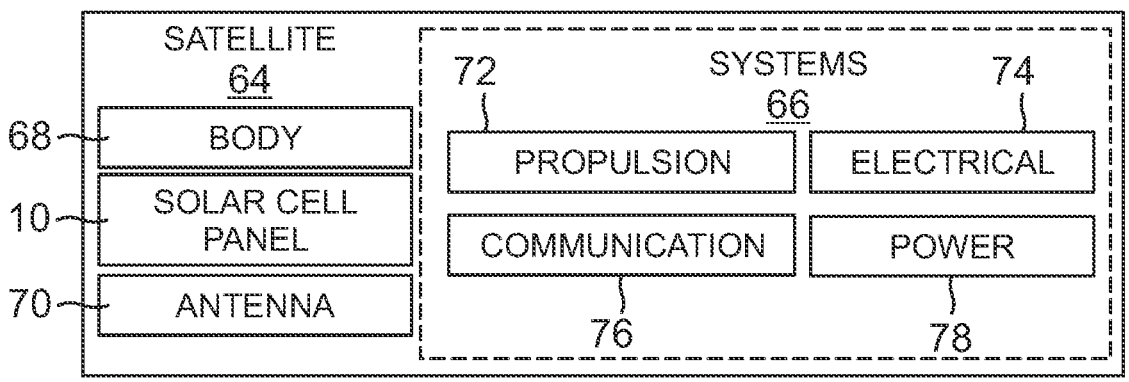

Examples of the disclosure may be described in the context of a method 40 of fabricating a solar cell 14, solar cell panel 10 and/or satellite, comprising steps 42-54 and 56-62, as shown in FIGS. 12 and 13, respectively, wherein the resulting satellite 64 having a solar cell panel 10 comprised of solar cells 14 are shown in FIG. 14.

As illustrated in FIG. 12, during pre-production, exemplary method 40 may include specification and design 42 of the solar cell 14, solar cell panel 10 and/or satellite 64, and material procurement 44 for same. During production, component and subassembly manufacturing 46 and system integration 48 of the solar cell 14, solar cell panel 10 and/or satellite 64 takes place, which include fabricating the solar cell 14, solar cell panel 10 and/or satellite 64. Thereafter, the solar cell 14, solar cell panel 10 and/or satellite 64 may go through certification and delivery 50 in order to be placed in service 52. The solar cell 14, solar cell panel 10 and/or satellite 64 may also be scheduled for maintenance and service 54 (which includes modification, reconfiguration, refurbishment, and so on), before being launched.

As illustrated in FIG. 13, the maintenance or service step 54 may include repairing 56 an existing solar cell 14 bonded on a substrate 12, wherein the existing solar cell 14 is defective, by bonding 58 a replacement solar cell 38 on top of the existing solar cell 14, without removing the existing solar cell 14. In one example, the bonding 58 of the replacement solar cell 38 on top of the existing solar cell 14 uses a controlled adhesive 32 pattern.

Moreover, electrical connections 18 for the existing solar cell 14 and the replacement solar cell 38 are made using electrical conductors 22 on, above or embedded within the substrate 12. In one example, the electrical conductors 22 extend underneath the replacement solar cell 38.

The repairing 56 of the existing solar cell 14 may further comprise removing 60 interconnects 34 for the electrical connections 18 for the existing solar cell 14.

The repairing 56 of the existing solar cell 14 may further comprise welding or soldering 62 replacement interconnects 40 for the electrical connections 18 for the replacement solar cell 38. In one example, replacement interconnects 40 for the electrical connections 18 are welded or soldered to the substrate 12, such as the Cu layer 24A on the substrate 12. In another example, replacement interconnects 40 for the electrical connections 18 are welded or soldered above the substrate 12. In yet another example, the replacement interconnects 40 are welded or soldered outside a stack comprised of the replacement solar cell 38 bonded to the existing solar cell 14.

Each of the processes of method 40 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 14, a satellite 64 fabricated by exemplary method 40 may include systems 66, a body 68, solar cell panels 10 comprised of solar cells 14, 38, and one or more antennae 70. Examples of the systems 66 included with the satellite 64 include, but are not limited to, one or more of a propulsion system 72, an electrical system 74, a communications system 76, and a power system 78. Any number of other systems 66 also may be included.

Functional Block Diagram

Figure 15:
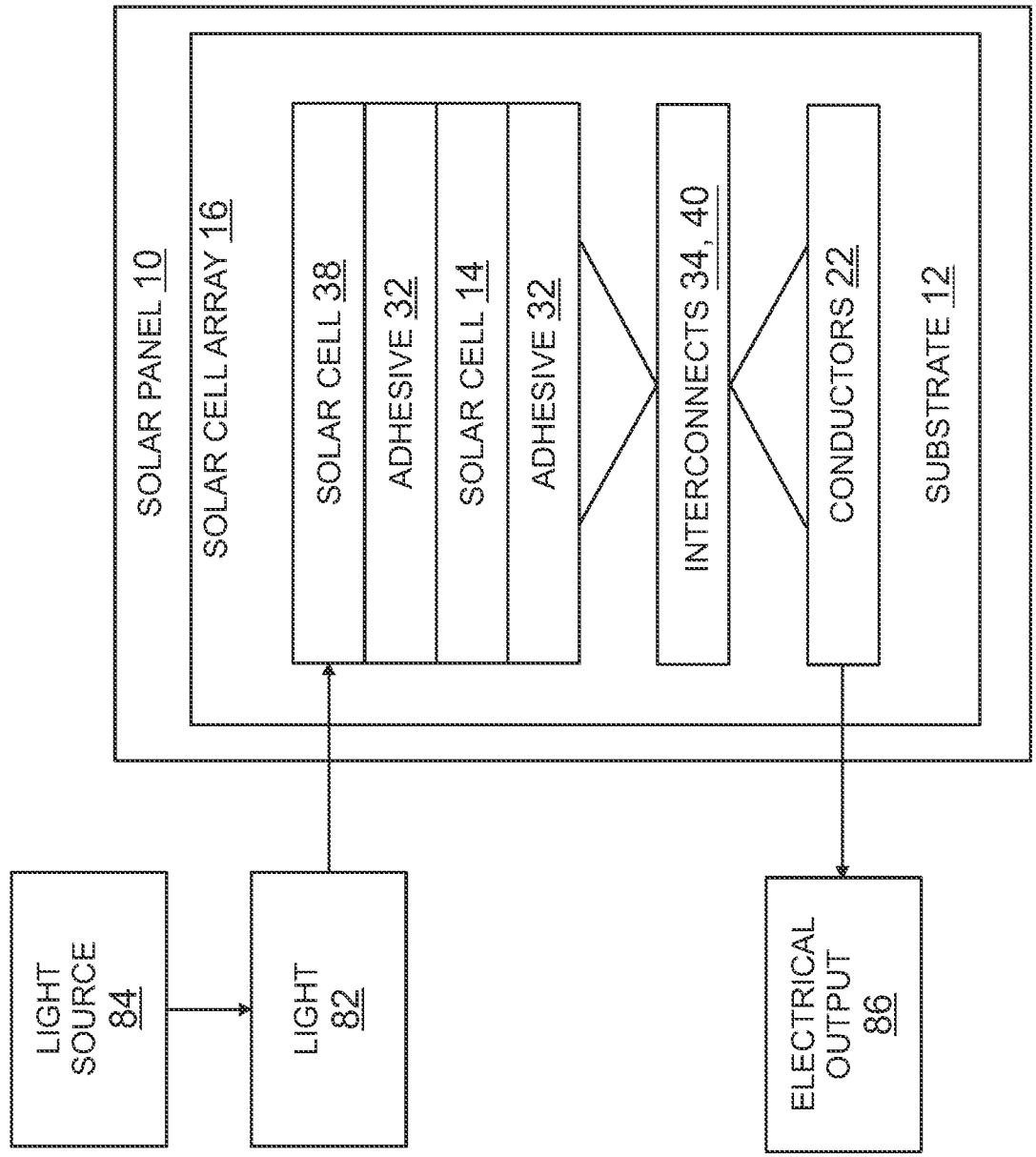
FIG. 15 illustrates an example of the disclosure made in the form of a functional block diagram.

FIG. 15 is an illustration of a solar cell panel 10 in the form of a functional block diagram. The solar cell panel 10 is comprised of a substrate 12 and one or more solar cells 14, 38 arranged in an array 16 and bonded on the substrate 12, wherein the substrate 12 comprises a flexible circuit, printed circuit board, or flex blanket. Each of the solar cells 14, 38 absorbs light 82 from a light source 84 and generates an electrical output 86 in response thereto.

This functional block diagram describes a method of repairing an existing solar cell 14 bonded on the substrate 12, wherein the existing solar cell 14 is defective, by bonding a replacement solar cell 38 on top of the existing solar cell 14, without removing the existing solar cell 14, wherein the bonding of the replacement solar cell 38 on top of the existing solar cell 14 uses a controlled adhesive 32 pattern. Electrical connections 18 for the existing and replacement solar cells 14 are made using electrical conductors 22 on, above or embedded within the substrate 12. The method includes removing interconnects 34 for the electrical connections 18 for the existing solar cell 14, and welding or soldering replacement interconnects 40 for the electrical connections 18 for the replacement solar cell 38 to the substrate 12 or above the substrate 12. This may include welding or soldering replacement interconnects 40 for the electrical connections 18 for the replacement solar cell 38 outside a stack comprised of the replacement solar cell 38 bonded to the existing solar cell 14.

Conclusion

The description of the examples set forth above has been presented for purposes of illustration and description, and is not intended to be exhaustive or limited to the examples described. Many alternatives, modifications and variations may be used in place of the specific elements described above.

What is claimed is:

1. A method, comprising:
repairing an existing solar cell bonded on a substrate, wherein the existing solar cell is defective, by bonding a replacement solar cell on top of the existing solar cell, without removing the existing solar cell;
wherein the substrate includes at least a base layer, a first metal layer patterned to form first electrical conductors deposited on a first surface of the base layer, and a second metal layer patterned to form second electrical conductors deposited on a second surface of the base layer, wherein the second surface is opposite the first surface, and the first electrical conductors are electrically connected to the second electrical conductors;
wherein interconnects electrically connect the existing solar cell to the first electrical conductors deposited on the first surface of the base layer; and
replacement interconnects electrically connect the replacement solar cell to the first electrical conductors deposited on the first surface of the base layer, in a same location as the interconnects, or in an adjacent location that avoids the same location as the interconnects.

2. The method of claim 1, wherein the bonding of the replacement solar cell on top of the existing solar cell uses a controlled adhesive pattern.

3. The method of claim 1, wherein the electrical connections for the replacement solar cell are made using the replacement interconnects positioned above the substrate.

4. The method of claim 1, wherein the second electrical conductors extend underneath the replacement solar cell.

5. The method of claim 1, further comprising removing the interconnects for the electrical connections for the existing solar cell.

6. The method of claim 1, further comprising welding or soldering the replacement interconnects for the electrical connections for the replacement solar cell to the substrate.

7. The method of claim 1, further comprising welding or soldering the replacement interconnects for the electrical connections for the replacement solar cell above the substrate.

8. The method of claim 1, further comprising welding or soldering the replacement interconnects for the electrical connections for the replacement solar cell outside a stack comprised of the replacement solar cell bonded to the existing solar cell.

9. The method of claim 1, wherein the substrate comprises a flexible circuit, printed circuit board, flex blanket, or solar cell panel.

10. A structure, comprising:
a substrate for solar cells;
at least one existing solar cell bonded on the substrate, wherein the existing solar cell is defective; and
at least one replacement solar cell bonded on top of the existing solar cell, without removing the existing solar cell;
wherein the substrate includes at least a base layer, a first metal layer patterned to form first electrical conductors deposited on a first surface of the base layer, and a second metal layer patterned to form second electrical conductors deposited on a second surface of the base layer, wherein the second surface is opposite the first surface, and the first electrical conductors are electrically connected to the second electrical conductors;
wherein interconnects electrically connect the existing solar cell to the first electrical conductors deposited on the first surface of the base layer; and
replacement interconnects electrically connect the replacement solar cell to the first electrical conductors deposited on the first surface of the base layer, in a same location as the interconnects, or in an adjacent location that avoids the same location as the interconnects.

11. The structure of claim 10, wherein the replacement solar cell is bonded on top of the existing solar cell using a controlled adhesive pattern.

12. The structure of claim 10, wherein the electrical connections for the replacement solar cell are made using the replacement interconnects positioned above the substrate.

13. The structure of claim 10, wherein the second electrical conductors extend underneath the replacement solar cell.

14. The structure of claim 10, wherein the interconnects for the electrical connections for the existing solar cell are removed.

15. The structure of claim 10, wherein the replacement interconnects for the electrical connections for the replacement solar cell are welded or soldered to the substrate.

16. The structure of claim 10, wherein the replacement interconnects for the electrical connections for the replacement solar cell are welded or soldered above the substrate.

17. The structure of claim 10, wherein the replacement interconnects for the electrical connections for the replacement solar cell are welded or soldered outside a stack comprised of the replacement solar cell bonded to the existing solar cell.

18. The structure of claim 12, wherein the substrate comprises a flexible circuit, printed circuit board, flex blanket, or solar cell panel.

19. A solar cell panel, comprising:
a substrate;
one or more solar cells arranged in an array and bonded to the substrate, wherein at least one of the solar cells is a defective solar cell; and
at least one replacement solar cell bonded on top of the defective solar cell, without removing the defective solar cell;
wherein the substrate includes at least a base layer, a first metal layer patterned to form first electrical conductors deposited on a first surface of the base layer, and a second metal layer patterned to form second electrical conductors deposited on a second surface of the base layer, wherein the second surface is opposite the first surface, and the first electrical conductors are electrically connected to the second electrical conductors;
wherein interconnects electrically connect the existing solar cell to the first electrical conductors deposited on the first surface of the base layer; and replacement interconnects electrically connect the replacement solar cell to the first electrical conductors deposited on the first surface of the base layer, in a same location as the interconnects, or in an adjacent location that avoids the same location as the interconnects.

20. The solar cell panel of claim 19, wherein the electrical connections for the replacement solar cell are made using the replacement interconnects positioned above the substrate.

* * * * *